United States Patent
Cho et al.

(10) Patent No.: US 8,840,967 B2
(45) Date of Patent: Sep. 23, 2014

(54) METHOD FOR MANUFACTURING PRINTED CIRCUIT BOARD INCLUDING FLAME RETARDANT INSULATION LAYER

(75) Inventors: Jae-Choon Cho, Suwon-si (KR); Myeong-Ho Hong, Suwon-si (KR); Hwa-Young Lee, Suwon-si (KR); Hee-Sun Chun, Suwon-si (KR); Choon-Keun Lee, Suwon-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 264 days.

(21) Appl. No.: 13/235,060

(22) Filed: Sep. 16, 2011

(65) Prior Publication Data

US 2012/0064231 A1 Mar. 15, 2012

Related U.S. Application Data

(63) Continuation-in-part of application No. 11/898,702, filed on Sep. 14, 2007, now abandoned.

(30) Foreign Application Priority Data

Oct. 11, 2006 (KR) .......................... 10-2006-0098709

(51) Int. Cl.
*B05D 5/12* (2006.01)
*B05D 3/10* (2006.01)
*C09K 21/14* (2006.01)
*H05K 1/03* (2006.01)

(52) U.S. Cl.
CPC .............. *C09K 21/14* (2013.01); *H05K 1/0393* (2013.01); *H05K 1/036* (2013.01); *H05K 1/0373* (2013.01); *H05K 2201/0209* (2013.01); *H05K 2201/012* (2013.01); *H05K 2201/0145* (2013.01); *H05K 1/0326* (2013.01)

USPC ...... 427/393.3; 427/97.4; 427/97.6; 427/98.4; 427/99.2; 427/336; 427/337; 427/340; 427/97.3

(58) Field of Classification Search
USPC ......... 427/97.3, 97.4, 97.6, 98.4, 99.2, 393.3, 427/336, 337, 340
See application file for complete search history.

(56) References Cited

U.S. PATENT DOCUMENTS 4,820,548 A * 4/1989 Courduvelis et al. ........ 427/98.7
5,700,607 A   12/1997 Rath et al.
(Continued)

FOREIGN PATENT DOCUMENTS

EP     0454929     * 12/1990
JP     11-001547 A   1/1999
(Continued)

OTHER PUBLICATIONS

Japanese Office Action issued in Japanese Patent Application No. 2012-112079 dated Jun. 18, 2013 with English Translation.

(Continued)

*Primary Examiner* — Brian K Talbot
(74) *Attorney, Agent, or Firm* — McDermott Will & Emery LLP (57) ABSTRACT

The present invention relates to a method for manufacturing a printed circuit board including a flame retardant insulation layer. The printed circuit board of the present invention exhibits excellent thermal stability and excellent mechanical strength, is suitable for imprinting lithography process, provides improved reliability by reducing coefficient of thermal expansion, and has excellent adhesion between circuit patterns and an insulation layer.

13 Claims, 6 Drawing Sheets

(56) References Cited

U.S. PATENT DOCUMENTS

| | | | |
|---|---|---|---|
| 7,025,867 B2* | 4/2006 | Czeczka et al. | 205/159 |
| 2002/0119317 A1 | 8/2002 | Gan et al. | |
| 2003/0044588 A1 | 3/2003 | Komoto et al. | |
| 2004/0131844 A1 | 7/2004 | Shinozaki | |

FOREIGN PATENT DOCUMENTS

| | | |
|---|---|---|
| JP | 2001-291960 A | 10/2001 |
| JP | 2001-291963 A | 10/2001 |
| JP | 2002-012655 A | 1/2002 |
| JP | 2005-187800 A | 7/2005 |
| JP | 2008-095105 A | 4/2008 |
| JP | 2010-251700 A | 11/2010 |
| JP | 2011-162806 A | 8/2011 |
| WO | WO-2005/100433 A1 | 10/2005 |

OTHER PUBLICATIONS

Japanese Office Action, with English translation, issued in Japanese Patent Application No. 2007-264562, dated Jun. 8, 2010.

* cited by examiner

METHOD FOR MANUFACTURING PRINTED CIRCUIT BOARD INCLUDING FLAME RETARDANT INSULATION LAYER

CROSS-REFERENCE TO RELATED APPLICATIONS

This application claims the benefit of Korean Patent Application No. 10-2006-0098709 filed on Oct. 11, 2006 with the Korean Intellectual Property Office, the contents of which are incorporated here by reference in their entirety.

This application is a continuation-in-part of U.S. patent application Ser. No. 11/898,702 filed on Sep. 14, 2007, the contents of which are incorporated here by reference in their entirety.

TECHNICAL FIELD

The present invention relates to a method for manufacturing a printed circuit board including a flame retardant insulation layer.

BACKGROUND

Recently, in response to the trend for electronic devices with greater miniaturization, thinner shaping, and lighter weighting, the high density mounting is required. A method for forming a wiring pattern by using a conventional photo lithography type has a limit in forming a micro-wiring by the use of a photoresist, and has many troubles in processing. Recently, an imprinting lithographic method for forming a minute wiring pattern to the nano size has been proposed. In the imprinting lithographic method, a conventional insulating material with a fixed curing degree is made to the semi-hardened state, a pattern is formed by stamping as a seal is affixed, and a micro-pattern is formed by plating a conductive metal in the inside of the pattern. But in case of the imprinting lithographic method, there are some problems that a selection width of a curing degree is narrow so that a restriction is brought to the processing condition, it is difficult to fit the exact curing condition so that a transfer is not made, or a stamp has the problem of a releasing property so that the failure rate of a substrate is raised.

Generally, in case of a polymer material which is an insulating material used for a printed circuit board or a semiconductor mounting substrate, an inorganic filler is used in order to overcome a limit of resin property and to endow with a desired function. But in case an inorganic filler is contained in a circuit board with large amount, there are some problems that the brittleness of a substrate increases, the adhesive force between a resin and a conductive wire decreases, and thus the mobility at the semi-cured state decreases. Therefore, to control resin properties is needed in order to bring out desired properties by employing the inorganic filler and to be suitable for performing the imprinting process.

Moreover, the halogen compound such as bromine and chlorine was used conventionally in order to give the flame retardancy of a substrate. However, it is known that the halogen compound produces the harmful dioxin to the human body during the combustion, so that the use is restricted. Therefore, the technology development on providing the flame retardancy by using a non-halogen compound is currently under way.

DISCLOSURE

Technical Problem

The present invention is to solve the problems associated with the conventional technologies described above by providing a method for manufacturing a flame retardant insulation layer which not only exhibits excellent thermal stability and mechanical strength but also reduces coefficient of thermal expansion, and a printed circuit board using the same.

Technical Solution

According to an aspect of the invention, there is provided a method for manufacturing a printed circuit board comprising:
forming a flame retardant insulation layer by coating a flame retardant resin composition on the surface of a substrate, the composition comprising:
(a) a complex epoxy resin comprising 5 to 20 parts by weight of a bisphenol A type epoxy resin with an average epoxy resin equivalent of 100 to 700, 30 to 60 parts by weight of a cresol novolac epoxy resin with an average epoxy resin equivalent of 100 to 600, 5 to 15 parts by weight a rubber-modified epoxy resin with an average epoxy resin equivalent of 100 to 500, and 15 to 30 parts by weight of a phosphorus type epoxy resin with an average epoxy resin equivalent of 400 to 800;
(b) an amino triazine type curing agent;
(c) a curing accelerator; and
(d) an inorganic filler,
precuring the substrate on which the flame retardant insulation layer is formed;
forming roughness on the flame retardant insulation layer; and
forming circuit patterns on the flame retardant insulation layer on which the roughness is formed.

According to an embodiment of the present invention, the amino triazine type curing agent may be mixed in an equivalent ratio of 0.3 to 1.5 with respect to a total epoxy group equivalent of the complex epoxy resin.

According to an embodiment of the present invention, the curing accelerator may be added by 0.1 to 1 parts by weight with respect to 100 parts by weight of the complex epoxy resin.

According to an embodiment of the present invention, the curing accelerator may be added by 0.2 to 0.3 parts by weight with respect to 100 parts by weight of the complex epoxy resin.

According to an embodiment of the present invention, the inorganic filler may be added by 20 to 50 parts by weight with respect to 100 parts by weight of the complex epoxy resin.

According to an embodiment of the present invention, the curing accelerator may be an imidazole type compound.

According to an embodiment of the present invention, the curing accelerator may be at least one selected from the group consisting of 2-ethyl-4-methyl imidazole, 1-(2-cyanoethyl)-2-alkylimidazole, 2-phenyl imidazole and a mixture thereof.

According to an embodiment of the present invention, the inorganic filler may be at least one inorganic material selected from the group consisting of barium titanium oxide, barium strontium titanate, titanium oxide, lead zirconium titanate, lead lanthanum zirconate titanate, learn magnesium niobate-lead titanate, silver, nickel, nickel-coated polymer sphere, gold-coated polymer sphere, tin solder, graphite, tantalum nitide, metal silicon nitride, carbon black, silica, clay and aluminum borate.

According to an embodiment of the present invention, the inorganic filler may be surface-treated with a silane coupling agent.

According to an embodiment of the present invention, the inorganic filler may include spherical fillers of which the sizes are different each other.

According to an embodiment of the present invention, the step of precuring may be performed by maintaining a temperature at 140° C. to 160° C. for 20 to 40 minutes.

According to an embodiment of the present invention, the step of forming roughness may comprise:

treating the substrate on which the flame retardant insulation layer is formed with 2-(2-butoxyethoxy)ethanol and ethane-1,2-diol;

etching the result with 55 g/L NaMnO4, 18 g/L Na2MnO4, 45 g/L NaOH water solution; and neutralizing with 60% $H_2SO_4$.

According to an embodiment of the present invention, the step of neutralizing may further comprise immersing in a 20-60% HF solution.

According to an embodiment of the present invention, when the step of immersing in a 20-60% HF solution is included, it may further comprise precuring at 170° C. for 30 to 60 minutes.

Advantageous Effect

A printed circuit board according to the invention may exhibit excellent thermal stability and mechanical strength, provide improved reliability by reducing coefficient of thermal expansion and further have excellent adhesion between circuit patterns and an insulation layer.

DETAILED DESCRIPTION

Hereinafter, the present invention will be explained in more detail.

According to an aspect of the invention, there is provided a method for manufacturing a printed circuit board comprising:

forming a flame retardant insulation layer by coating a flame retardant resin composition on the surface of a substrate, the composition comprising:

(a) a complex epoxy resin composed of 5 to 20 parts by weight of a bisphenol A type epoxy resin with an average epoxy resin equivalent of 100 to 700, 30 to 60 parts by weight of a cresol novolac epoxy resin with an average epoxy resin equivalent of 100 to 600, 5 to 15 parts by weight a rubber-modified epoxy resin with an average epoxy resin equivalent of 100 to 500, and 15 to 30 parts by weight of a phosphorus type epoxy resin with an average epoxy resin equivalent of 400 to 800;

(b) an amino triazine type curing agent;

(c) a curing accelerator; and (d) an inorganic filler, precuring the substrate on which the flame retardant insulation layer is formed;

forming roughness on the flame retardant insulation layer; and forming circuit patterns on the flame retardant insulation layer on which the roughness is formed.

The complex epoxy resin used in the present invention is an epoxy resin which does not contain halogen and is composed with a bisphenol A type epoxy resin, a cresol novolac epoxy resin, a rubber-modified epoxy resin and a phosphorus type epoxy resin.

Here, an average epoxy resin equivalent of the bisphenol A type epoxy resin may be 100 to 700. If the average epoxy resin equivalent is less than 100, it is difficult to obtain desired properties. On the other hand, if the average epoxy resin equivalent is more than 700, it is difficult to dissolve in a solvent and to control due to a high melting point. Also, a content of the bisphenol A type epoxy resin may be 5 to 20 parts by weight in the complex epoxy resin. If the content of bisphenol A type epoxy resin is less than 5 parts by weight, the adhesive force with the wiring material is deteriorated. On the other hand, if the content of bisphenol A type epoxy resin is more than 20 parts by weight, the thermal property and the electrical property decrease. The resin may be used by dissolving in a mixed solvent of 2-methoxyethanol, methyl ethyl ketone (MEK), dimethyl formamide (DMF) and/or methyl cellosolve (MCS).

The cresol novolac epoxy resin is used as an epoxy resin of the novolak type. This is because that a cured material with high heat resistance can be obtained and that the thermal stability of a formed substrate can be improved. An average epoxy resin equivalent of the cresol novolac epoxy resin may be 100 to 600 and a content of the cresol novolac epoxy resin may be 30 to 60 parts by weight in the complex epoxy resin. If the average epoxy resin equivalent is less than 100, it is difficult to obtain desired properties. On the other hand, if the average epoxy resin equivalent is more than 600, it is difficult to dissolve in a solvent and to control due to a high melting point. Further, if the content of the cresol novolac epoxy resin is less than 30 parts by weight, it is difficult to obtain desired properties. On the other hand, if the content of the cresol novolac epoxy resin is more than 60 parts by weights, the electrical and the mechanical property are lowered. The cresol novolac epoxy resin may be used by dissolving in a mixed solvent of 2-methoxyethanol, methyl ethyl ketone (MEK), dimethyl formamide (DMF) and/or methyl cellosolve (MCS).

The rubber-modified epoxy resin may be obtained by mixing diglycidyl ether of bisphenol A (DGEBA) and amine terminated butadiene acrylonitrile copolymer (ATBN), and its average epoxy resin equivalent may be 100 to 500. If the average epoxy resin equivalent is less than 100, it is difficult to obtain desired properties. On the other hand, if the average epoxy resin equivalent is more than 500, it is difficult to dissolve in a solvent and to control due to a high melting point. A content of the rubber-modified epoxy resin may be 5 to 15 parts per weight in the complex epoxy resin. If a content of the rubber-modified epoxy resin is less than 5, the obtained insulation material is easy to break which further cause cracks. On the other hand, if the content of the rubber-modified epoxy resin is more than 15, desired properties cannot be obtained. The rubber-modified epoxy resin may be used by dissolving in a mixed solvent of 2-methoxyethanol, methyl ethyl ketone (MEK), dimethyl formamide (DMF) and/or methyl cellosolve (MCS).

The phosphorus type epoxy resin shows excellent flame retardant and self-extinguishing property. The phosphorus type epoxy resin may be added in order to give a flame retardant property of a printed circuit board. And an environment-friendly flame retardant substrate can be obtained because halogen is not included in the flame retardant substrate. An average epoxy resin equivalent of the phosphorus type epoxy resin may be 400 to 800. If the average epoxy resin equivalent is less than 400, desired properties are not obtained. On the other hand, if the average epoxy resin equivalent is less than 800, it is difficult to dissolve in a solvent and to control due to a high melting point. The content of the phosphorus type epoxy resin may be 15 to 30 parts by weight in the complex epoxy resin. If the content of the phosphorus type epoxy resin is less than 15 parts by weight, it is difficult to obtain a flame retardant property. On the other hand, if the content of the phosphorus type epoxy resin is more than 30 parts by weight, electrical and mechanical properties decrease. The phosphorus type epoxy resin may be used by dissolving in a mixed solvent of 2-methoxyethanol, methyl ethyl ketone (MEK), dimethyl formamide (DMF) and/or methyl cellosolve (MCS).

According to a preferred embodiment, an equivalent ratio of the amino triazine type curing agent may be 0.3 to 1.5 with respect to the total epoxy group equivalent of the complex epoxy resin. If the amino triazine type curing agent is mixed within the range of the equivalent ratio, a curing degree of a cured insulation layer, in other words, of a substrate can be controlled to a desired extent enough to perform an imprinting process and the thermal expansion of a substrate can be reduced to the utmost. If the equivalent ratio is less than 0.3, a flame retardancy of a composition decreases. On the other hand, if the ratio is more than 1.5, adhesive property and storage stability decrease. The most preferable equivalent ratio of the amino triazine type curing agent may be 0.6.

The curing agent used in the present invention is to improve the thermal stability of insulating materials. The curing agent according to the present invention may be an amino triazine type curing agent including a nitrogen-based compound to provide a resin composition having excellent retardant property and low coefficient of thermal expansion. In particular, the curing agent may have a softening point of 100 to 150 t and a content of nitrogen may be 10 to 30 weight % and a hydroxy group equivalent may be 100 to 200.

The curing accelerator according to the present invention may be an imidazole type curing accelerator. Also the curing accelerator according to the present invention may be at least one selected from the group consisting of 2-ethyl-4methyl imidazole, 1-(2-cyanoethyl)-2-alkylimidazole, 2-phenyl imidazole and a mixture thereof, but it is not limited to them. Here, the curing accelerator may be added by 0.1 to 1 parts by weight, particularly 0.2 to 0.3 parts by weight with respect to 100 parts by weight of the complex epoxy resin. If the content of the curing accelerator is less than 0.1 parts by weight, a rate of curing can significantly decrease and thus the curing cannot be completed and a problem can be occurred during releasing in the imprinting process. On the other hand, if the content of the curing accelerator is more than 1 part by weight, the fast curing is occurred so that a pattern may not be transferred in the imprinting process.

Additionally a content of the phosphorous flame retardant epoxy resin, of which price is relatively high, can be lowered by adding a flame retardant adjuvant. The compound such as $Al_2O_3$ which additionally has a phosphorous can be used as the flame-retardant adjuvant.

According to an embodiment of the invention, the inorganic filler may be at least one inorganic material selected from the group consisting of barium titanium oxide, barium strontium titanate, titanium oxide, lead zirconium titanate, lead lanthanum zirconate titanate, learn magnesium niobate-lead titanate, silver, nickel, nickel-coated polymer sphere, gold-coated polymer sphere, tin solder, graphite, tantalum nitride, metal silicon nitride, carbon black, silica, clay and aluminum borate.

The inorganic filler used in the present invention can be added in order to reinforce properties such as mechanical strength of a cured material which is usually insufficient in a cured material composed with only epoxy resins, and may be any electric insulating material which is generally used.

Here, the inorganic filler may be added by 20 to 50 parts by weight with respect to 100 parts by weight of the complex epoxy resin. If the content of the inorganic filler is less than 20 parts by weight, it is difficult to obtain a desired mechanical property. On the other hand, if the content of the inorganic filler is more than 50 parts by weight, the phase separation may occur.

Further, the inorganic filler may be surface-treated with a silane coupling agent and it is apparent that spherical fillers having different sizes each other be used. The silane coupling agent may be amino type, epoxy type, acryl type, vinyl type, or the like, but not limited to them. Moreover, the inorganic filler having spherical shapes and different sizes, may be used to increase flowability inside of the resin composition and thermal and mechanical properties by raising packing density after curing.

It is apparent that coefficient of thermal expansion of a substrate be similar to that of conductive wirings as possible since when the difference in the coefficient of thermal expansion between the substrate and the conductive wirings is large, it causes cracks between the substrate and the conductive wirings to deteriorate reliability of the substrate.

According to an aspect of the invention, there is provided a method for manufacturing a flame retardant insulation layer which not only exhibits excellent thermal stability and mechanical strength but also reduces thermal expansion, and a printed circuit board using the same.

Figure 2:
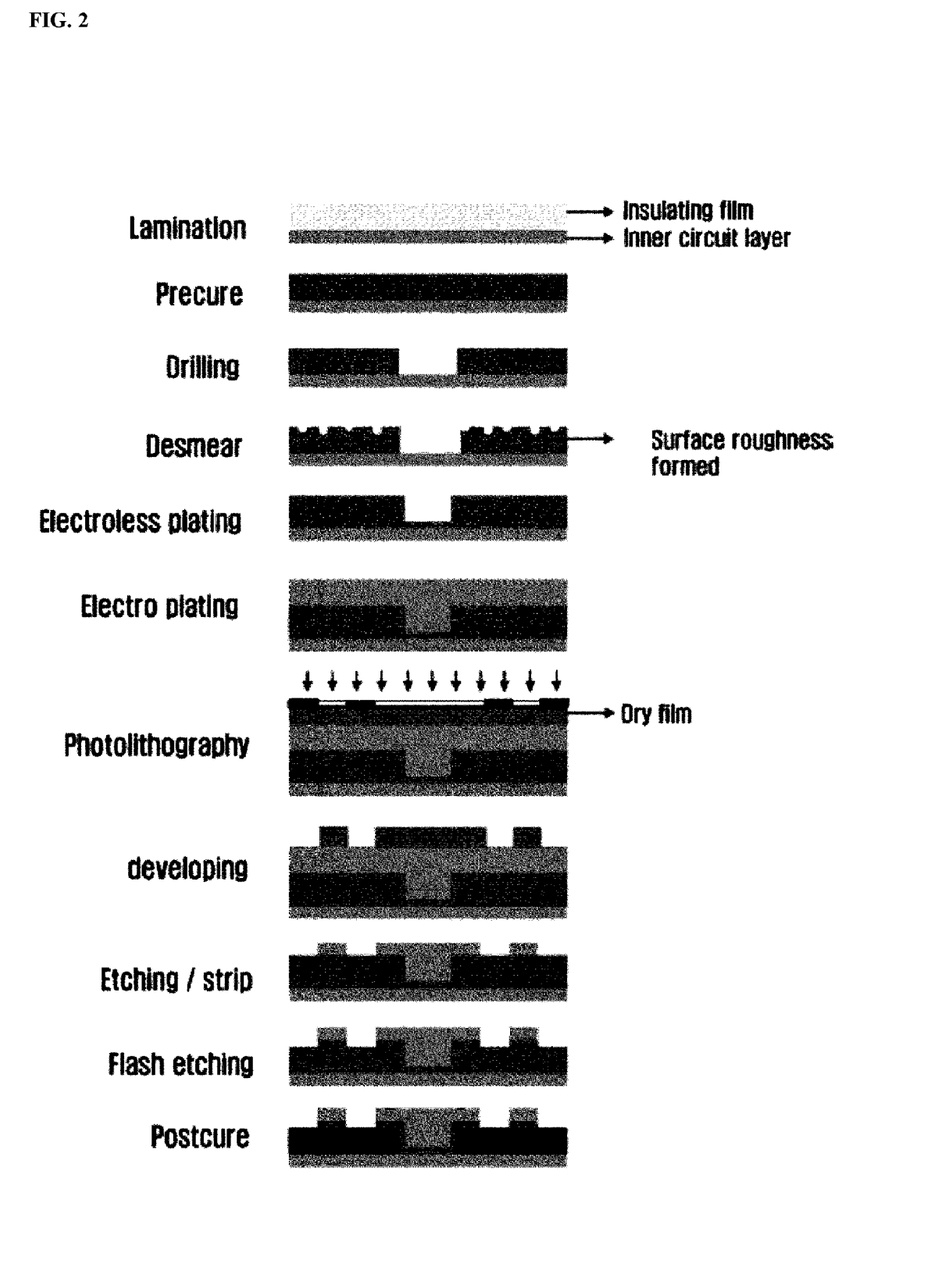
FIG. 2 illustrates a process for manufacturing a printed circuit board according to an embodiment of the present invention.

The flame retardant resin composition may be used to form circuits by employing a general PCB manufacturing process and its process is shown in FIG. 2.

A substrate, on which the flame retardant insulation layer is coated, may be any material, without limitation, which can be used in the process for manufacturing PCBs. A substrate may be a PET sheet.

Here, the flame retardant insulation layer may have a thickness of 25 to 80 μm. If the thickness of the flame retardant insulation layer is less than 25 μm, the insulating property is deteriorated, while if it is more than 80 μm, it increases the thickness of a printed circuit board.

Referring to FIG. 2, a copper layer may be formed on a flame retardant insulation layer by chemical plating and electro plating, and circuit patterns may be formed by a photolithography method.

Adhesion between circuit pattern and the insulation layer which exists under them is important for reliability of PCBs. Appropriate conditions for the adhesion may be obtained by determining peel-strength.

Figure 3:
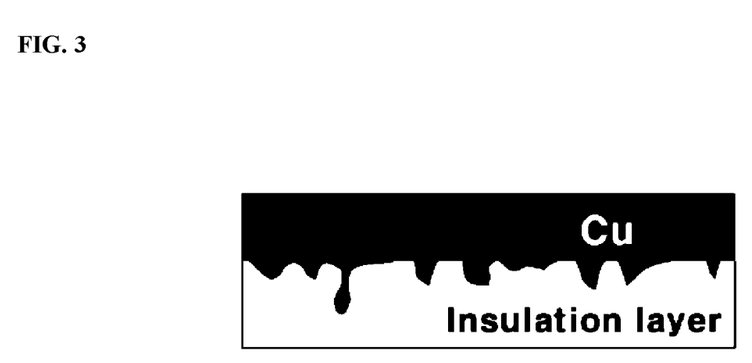
FIG. 3 illustrates a schematic cross-section view of an insulation layer according to an embodiment of the present invention.

Factors affecting the peel-strength can be divided into two factors of which one is an interfacial adhesion at the interface between a copper layer and an insulating material and the other is anchoring effect associated with roughness as shown in FIG. 3. Among these two factors, the anchoring effect is more important than the other.

Roughness may be thus formed on the flame retardant insulation layer for such anchoring effect by performing precuring and desmear process of which conditions are optimized for the resin composition forming the flame retardant insulation layer.

The flame retardant insulation layer may be cured to a proper curing degree through the precuring process. Then, the desmear process (chemical wet process) may be performed to form roughness on the surface of the insulation material.

The adhesion between the flame retardant insulation layer and the substrate is able to increase through these processes.

According to an embodiment of the invention, the step of precuring may be performed by maintaining a temperature at 140 to 160° C. for 20 to 40 min.

Table 1 below shows curing degree and its corresponding peel strength of the flame retardant resin composition. The curing degree is determined by the differential scanning calorimetry (DSC). The DSC applies the same temperature program to a sample and an inert reference to determine the curing degree of the resin by measuring difference in heat flow generated from the sample.

TABLE 1

| Curing temperature (° C./time) | Curing degree | Peel strength (kN/cm) |
|---|---|---|
| 130/30 min | 56.7 | 0.1 |
| 140/30 min | 66.6 | 0.78 |
| 150/30 min | 79.8 | 0.76 |
| 160/30 min | 87.1 | 0.48 |
| 170/30 min | 91.7 | 0.30 |

Referring to Table 1, it is noted that when the precuring temperature is lower than 140° C. or higher than 160° C., the curing degree is relatively low and peel strength is significantly low.

When precuring is performed at 130° C. for 30 min, the peel strength is only 0.1 kN/cm.

It is necessary to have sufficient curing degree not to dissolve out the resin in the surface during the desmear process. However, when the curing does not occur sufficiently under the above conditions of lower than 140° C. or higher than 160° C., the resin in the surface dissolves out by being attacked from another reactant during the desmear process and this causes rapid increase of silica filler ratio on the surface of the insulation layer, resulting in lowering the peel strength.

On the other hand, it is also noted that when precuring is performed at 140° C. or 150° C. for 30 min, the peel strength is more than 0.6 kN/cm since the resin forming the flame retardant insulation layer is cured to a proper curing degree and thus allowed having appropriate roughness.

When precuring is performed at 160° C. for 30 min, the curing degrees becomes too high to obtain proper etching during the desmear process. In this case, the roughness of the surface cannot be formed efficiently and the peel strength is also accordingly lowered.

Figure 4:
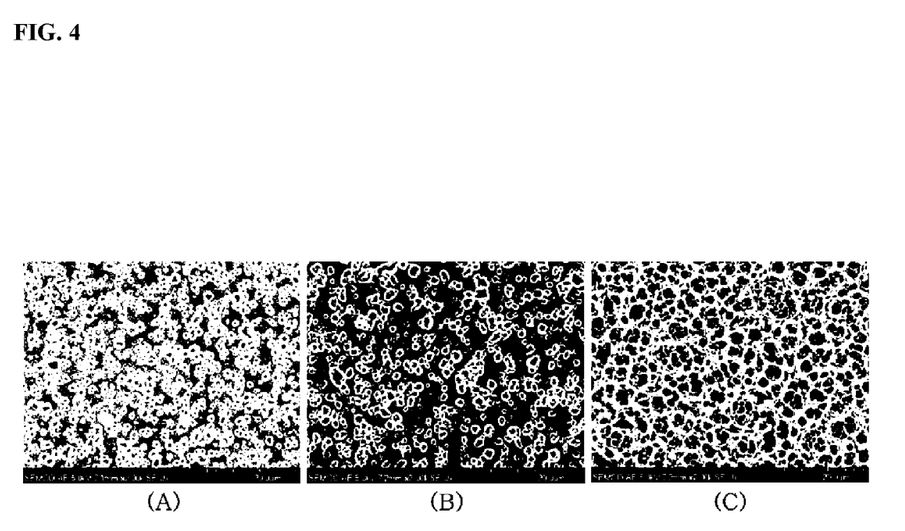
FIG. 4 is electron micrographs illustrating the surface of a flame retardant insulation layer after precuring in different condition, followed by a desmear process ((A) 170° C./30 min, (B) 160° C./30 min, (C) 140° C., 150° C./30 min).

FIG. 4 is electron micrographs illustrating the surface of a flame retardant insulation layer after precuring in different condition, ((A) 170° C./30 min, (B) 160° C./30 min, (C) 140° C., 150° C./30 min), followed by a desmear process.

Referring to FIG. 4, it is noted that when precuring is performed at 140-150° C. for 30 min, it provides the desired roughness.

The adhesion between the flame retardant insulation layer and the substrate is increased by forming roughness on the surface of retardant insulation layer through the precuring and desmear process (chemical wet process).

According to an embodiment of the invention, the desmear process for forming roughness comprises:

treating the substrate, on which the flame retardant insulation layer is coated, with 2-(2-butoxyethoxy) ethanol and ethane-1,2-diol;

etching the result with 55 g/L NaMnO4, 18 g/L Na2MnO4, 45 g/L NaOH water solution; and neutralizing with 60% $H_2SO_4$.

Conditions for the desmear process may be divided into 3 steps of swelling, chemical etching and reduction.

The step of swelling may include treating the substrate with a solution of 2-(2-butoxyethoxy)ethanol and ethane-1,2-diol.

The step of etching may include etching the surface of the insulation layer with an etching solution. Here, the etching solution may be composed of 55 g/L NaMnO4, 18 g/L $Na_2MnO_4$, 45 g/L NaOH water solution.

The step of reduction may include neutralizing with 60% $H_2SO_4$ to neutralize the etching solution remained after the etching process.

According to an embodiment of the invention, the desmear process may further include acid dipping to optimize the peel strength.

The step of acid dipping may include dipping the insulation layer processed for the desmear process into a bath of 5 weight % to 10 weight % sulphuric acid solution.

Figure 5:
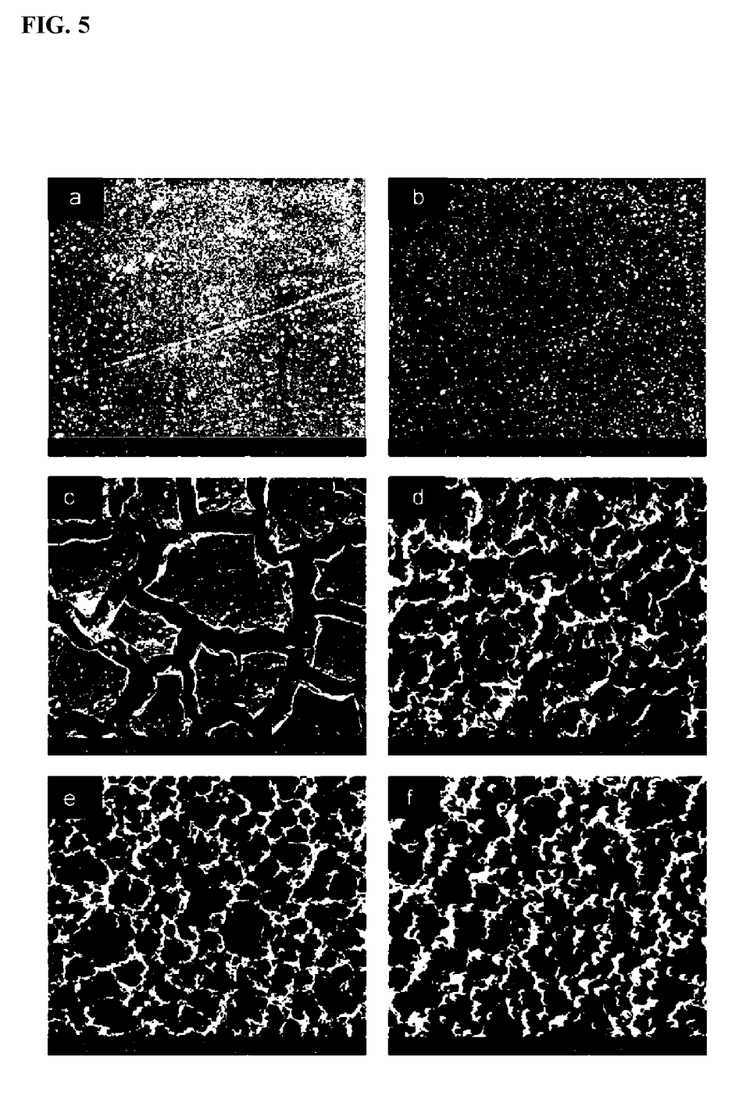
FIG. 5 is electron micrographs illustrating the surface of a flame retardant insulation layer after (a) precuring, (b) swelling, (c) microetching, (d) reduction, (e) acid-dipping and (f) chemical plating.

FIG. 5 is electron micrographs illustrating the surface of a flame retardant insulation layer after (a) precuring, (b) swelling, (c) microetching, (d) reduction, (e) acid-dipping and (f) chemical plating.

Figure 6:
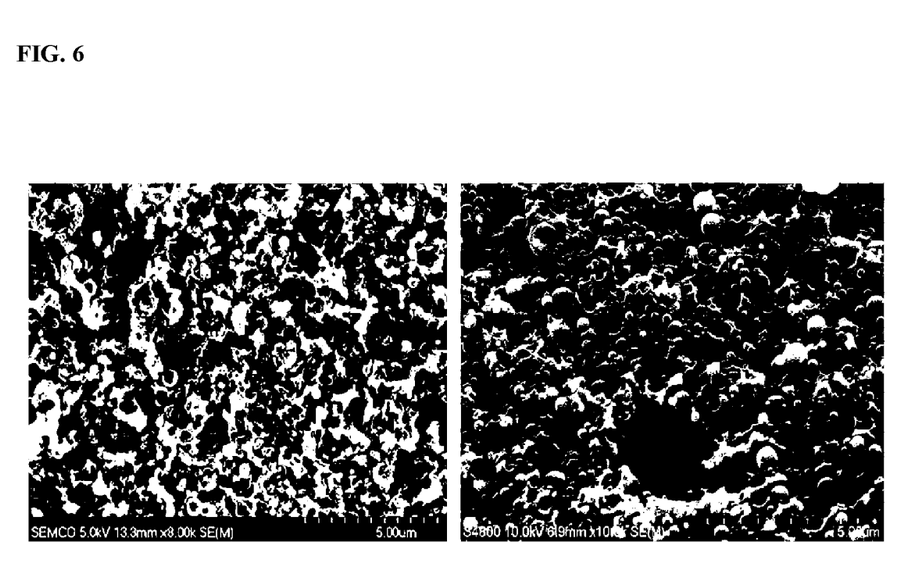
FIG. 6 is electron micrographs illustrating the surface of a flame retardant insulation layer with HF treatment (left) and without HF treatment (right).

Referring to FIG. 5, it is noted that a complete microstructure having excellent peel strength is formed through the acid dipping process for about 1 min to 5 min as shown in FIG. 6(e).

Referring to Table 4 below, it is noted that the adhesion is improved with the acid dipping process. It shows that peel strength of the insulation layer processed for the precuring, desmear and acid dipping process is significantly higher than that processed only for the precuring and desmear process.

The step of forming roughness may further include immersing in a 20-60% HF solution. The step of immersing in the HF solution may be performed during or after reduction of the insulation layer processed for the acid dipping process.

When the immersing step is additionally performed, precuring may be performed at 170° C. for 30 min to 60 min.

FIG. 6 is electron micrographs illustrating the surface of a flame retardant insulation layer with HF treatment and without HF treatment.

Referring to FIG. 6, when the flame retardant insulation layer is treated with HF (left image), it is noted that roughness of the surface is denser. HF dissolves silica filler included in the retardant resin composition so that it allows filling more efficiently air gaps present between the filler and the cured resin composition. A conductive layer to be formed later through chemical plating and electro plating process may be thus bonded much stronger due to anchoring effect.

When HF is used, it is apparent that it be cured as much as possible for the epoxy resin not to be attacked during the desmear process. Therefore, it is apparent that the curing be performed at the stronger condition as mentioned above.

Referring to FIG. 6 when HF is not treated (right image), it is noted that the silica filler may present as its original form on the surface of the flame retardant insulation layer, which does not help to improve the anchoring effect.

According to another aspect, there is provided a printed circuit board including an insulation layer formed by using the retardant resin composition.

An insulation layer of a variety of substrates such as BGAs, for example, a flexible printed circuit board (FPCB), a rigid PCB, a rigid-flexible PCB, a built-up substrate, a FCBGA (Flip chip ball grid array) and a PBGA (plastic ball grid array) may be formed by using the retardant resin composition of the present invention.

Embodiments relating to the invention were set forth above, hereinafter, explanations will be given in greater detail with reference to specific examples, and the protection scope of the present invention is not restricted to the following example.

EXAMPLES

Preparation of Flame Retardant Resin Composition 85 weight % bisphenol A type epoxy resin (Kookdo chemistry, YD-011) (solvent: 2-methoxyethanol), 85 weight % cresol novolac epoxy resin (Kookdo chemistry, YDCN-500-01P) (solvent: 2-methoxyethanol), rubber-modified epoxy resin (Kookdo chemistry, polydis 3615), 85 weight % phosphorous type flame retardant epoxy resin (Kookdo chemistry, KDP-550MC65) (solvent: 2-methoxyethanol), and 66.7 weight % amino triazine type novolac curing agent (GUN EI Chemical Industry co., ltd, PS-6313) were mixed, and the mixture was stirred with a rate of 300 rpm, at 90° C. for 1 hour.

Each compound is added as shown in Table 2.

Figure 1:
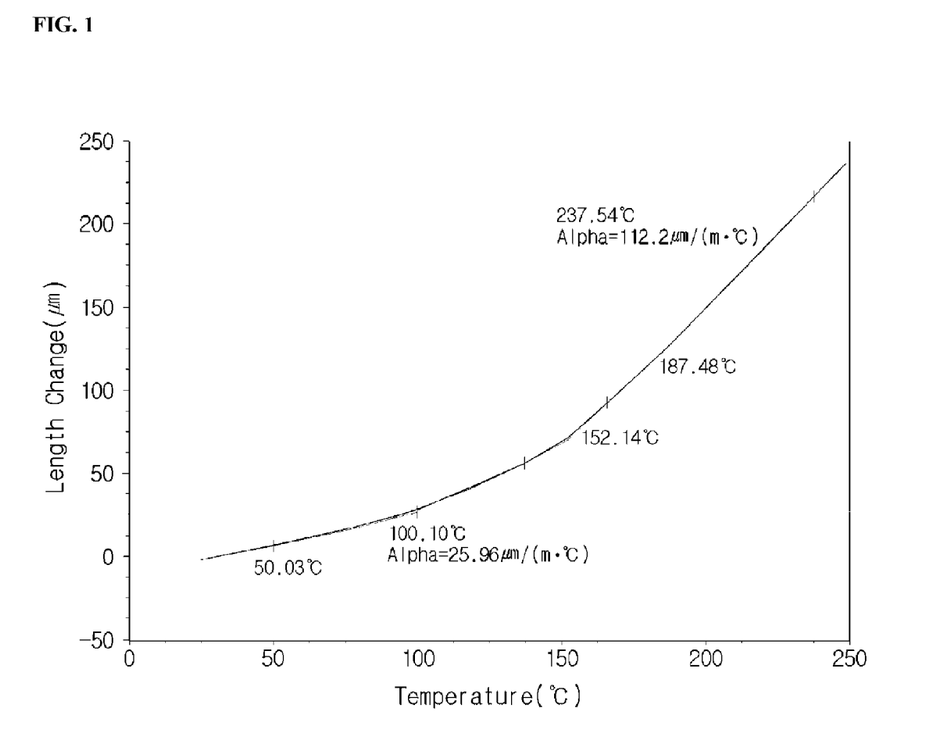
FIG. 1 illustrates a TMA graph of a resin composition according to an embodiment of the present invention.

Then, spherical silica having size distribution of 0.5 to 1.2 μm was added and the mixture was stirred at a rate of 400 rpm for 3 hours. The temperature was cooled to room temperature and then 2-ethyl-4-methyl imidazole was added and the mixture was stirred for 30 min to provide flame retardant resin composition.

sured. Results are summarized in Table 3. Moreover, TMA result graph of the composition C was shown in FIG. 1.

TABLE 3

|  | Flame retardancy (UL 94 V) | Tg | CTE(less than Tg) |
|---|---|---|---|
| Composition C | V-0 | 160.61 | 27.58 |
| Comparative Example 1 | V-1 | 155.9 | 54.4 |

Measuring Method of Physical Properties 1) flame retardancy measurement: according to UL 94 V (Vertical Burning Test) method, a sample was held perpendicularly and burned by a burner and the flame retardancy was rated as the V-2, V-1, V-0, 5V according to the extent of flaming combustion.

2) Tg and CTE measurement: Tg and CTE were measured by using the TMA Q 400 thermal analyzer of the TA Co, Ltd. Tg and CTE were measured at the temperature range of 25 to 250° C. with a heating speed of 10° C./min. Tg was adopted at the second scanning.

As shown in the Table 3, it is noted that the flame retardant composition of the present invention exhibits better flame retardancy compared to the conventional one because when the amino triazine type curing agent was used in the flame retardant composition of the present invention, the flame retardancy was rated as V-0, that is, the burning time of a sample is 10 seconds or less. It seems that the flame retardancy is additionally given by nitrogen contained in the amino triazine type curing agent. It is also noted that the flame retardant composition including the amino triazine type curing agent showed excellent CTE value in comparison with a flame retardant composition including the phenol novolac curing agent. It seems that NH groups in the curing agent besides OH groups reacting with the epoxy group are reacted additionally, so that a much denser structure of the cured material is formed.

TABLE 2

|  |  | Composition A | Composition B | Composition C | Composition D | Comparison Example |
|---|---|---|---|---|---|---|
| Epoxy resin | bisphenol A type epoxy resin | 10 | 10 | 10 | 10 | 10 |
|  | cresol novolac epoxy resin | 55 | 55 | 55 | 55 | 55 |
|  | rubber-modified epoxy resin | 10 | 10 | 10 | 10 | 10 |
|  | phosphorous type flame retardant epoxy resin | 25 | 25 | 25 | 25 | 25 |
| Curing agent | amino triazine type novolac curing agent | 32.30 | 32.30 | 32.30 | 32.30 | — |
|  | phenol novolac curing agent | — | — | — | — | 43.7 |
| Curing accelerator | 2-ethyl-4 methylimidazole | 5 | 2.5 | 1.25 | 0 | 0.5 |
| Inorganic filler | spherical silica | 81.09 | 81.09 | 81.09 | 81.09 | 88.04 |

Example 1

Determination of Retardancy, Tg and CTE

Each manufactured flame retardant resin composition was performed for film casting on each PET film, and completely cured by heat-treating at 140° C. for 30 minutes, and 200° C. for 120 minutes. Flame retardancy, Tg and CTE were mea- Example 2

Determination of Adhesion Depending on Acid Dipping Process

The flame retardant resin composition C was casted as a film form and then an insulation layer and wiring pattern were formed as shown the process in FIG. 2. Here, the difference in adhesion with and without the acid dipping process in the desmear process was shown in Table 4. As shown in Table 4, it is noted that the adhesion is stronger when the acid dipping process was performed.

TABLE 4

Determination of Adhesion Depending on Acid Dipping Process

|  | Precuring | Swell-ing | Micro-etching | Reduc-tion | Acid-dipping | Peel-strength |
|---|---|---|---|---|---|---|
| Composition C | 140° C./30 min | 7 min | 20 min | 5 min | 5 min | 0.78 kN/cm |
| Composition C | 140° C./30 min | 7 min | 20 min | 5 min | — | 0.52 kN/cm |

Example 3

Determination of Adhesion Depending on the HF Treatment

The flame retardant resin composition C was casted as a film form and then an insulation layer and wiring pattern were formed as shown the process in FIG. 2. Here, the difference in adhesion with and without the HF treatment in the desmear process was shown in Table 5. As shown in Table 5, it is noted that the adhesion is stronger when the HF treatment was performed.

TABLE 5

Measurement of Roughness and Adhesion Depending on the HF Treatment

|  | Precuring | Swelling | Microetching | Reduction | HF treatment | Peel-strength | Average roughness (Ra) |
|---|---|---|---|---|---|---|---|
| Composition C | 170° C./60 min | 7 min | 20 min | 5 min | 5 min | 0.82 kN/cm | 0.550 um |
| Composition C | 170° C./60 min | 7 min | 20 min | 10 min | — | 0.29 kN/cm | 0.225 um |

Example 4

Gelation Time of Epoxy Resin Depending on Curing Accelerator Content

Gelation time of epoxy resin depending on the curing accelerator content was determined by rheological analysis.

Table 6 shows rheological gel time depending on 2-ethyl-4-methyl imidazole used as curing accelerator content.

The rheological analysis was performed as follows.

Modulus or modulus of elasticity is defined as a ratio of stress to strain. Gel point is defined as the cross point of the dynamic storage modulus (G') and loss modulus (G").

The dynamic storage modulus (G'), loss modulus (G"), and viscosity were measured during the curing process using a viscoanalyzer (ARES, TA Instrument) at 110° C. Measurements were taken using a 25 mm disposable plate in dynamic time-sweep test mode, with the vibration inside the cylinder set to a frequency of 10 Hz.

Here, the dynamic time-sweep test mode was selected since it is an appropriate method to determine curing rate according to composition.

This set-up allowed us to measure the dynamic storage and loss moduli (G' and G") and the cross point of G' and G", which is defined as gel-time. The result is summarized in Table 6.

TABLE 6

Gelation time of Epoxy Resin Depending on Curing Accelerator Content

| Flame retardant resin composition | Curing agent | Curing accelerator (2E4MZ) (used amount per 100 g of epoxy resin) | Curing time (sec) (at 110° C.) | Adhesion (relative comparison of peel strength) |
|---|---|---|---|---|
| A | amino triazine type | 1.0 g | 666 | Very low |
| B | amino triazine type | 0.5 g | 1,048 | Low |
| C(composition of Example 1) | amino triazine type | 0.25 g | 1,889 | Very high |
| D | amino triazine type | 0 g | — | Very low |

Table 6 illustrates curing time and adhesion of compositions A, B, C and D depending on the content of the curing accelerator. It is noted that the more of the curing accelerator is used, the shorter the curing time is and the higher the viscosity of the insulation layer is (data is not shown).

It is necessary to obtain an optimal processing condition depending on composition which composes the insulation layer in order to maximize the adhesion between circuit patterns and the insulation layer.

As shown in Table 6, when the degree of curing is too high like composition A and B, the adhesion decreases since desired roughness cannot be obtained during the desmear process. It is noted that the peel strength of composition A is 0.3 kN/cm and that of composition B is 0.48 kN/cm.

It is also noted that when the curing accelerator is not used like composition D, the degree of curing is too low to be suitable for manufacturing PCBs.

As shown above, a printed circuit board having excellent adhesion between an circuit pattern and an insulation layer may be manufactured by using a method, the method comprising:

forming a flame retardant insulation layer by coating a flame retardant resin composition on the surface of a substrate, the composition comprising:
  (a) a complex epoxy resin composed of 5 to 20 parts by weight of a bisphenol A type epoxy resin with an average epoxy resin equivalent of 100 to 700, 30 to 60 parts by weight of a cresol novolac epoxy resin with an average epoxy resin equivalent of 100 to 600, 5 to 15 parts by weight a rubber-modified epoxy resin with an average epoxy resin equivalent of 100 to 500, and 15 to 30 parts by weight of a phosphorus type epoxy resin with an average epoxy resin equivalent of 400 to 800;
  (b) an amino triazine type curing agent;
  (c) a curing accelerator; and
  (d) an inorganic filler, precuring the substrate on which the flame retardant insulation layer is formed;

forming roughness on the flame retardant insulation layer; and forming circuit patterns on the flame retardant insulation layer on which the roughness is formed.

It is apparent that the present invention is not limited to the embodiments set forth above and many of applications may be made by those skilled in the art without departing from the principle and spirit of the present invention, the scope of which is defined in the appended claims and their equivalents.

What is claimed is:

1. A method for manufacturing a printed circuit board comprising:
    forming a flame retardant insulation layer by coating a flame retardant resin composition on the surface of a substrate, the composition comprising:
        (a) a complex epoxy resin composed of 5 to 20 parts by weight of a bisphenol A epoxy resin with an average epoxy resin equivalent of 100 to 700, 30 to 60 parts by weight of a cresol novolac epoxy resin with an average epoxy resin equivalent of 100 to 600, 5 to 15 parts by weight a rubber-modified epoxy resin with an average epoxy resin equivalent of 100 to 500, and 15 to 30 parts by weight of a phosphorus-containing epoxy resin with an average epoxy resin equivalent of 400 to 800;
        (b) an amino triazine-containing curing agent;
        (c) a curing accelerator; and
        (d) an inorganic filler,
    precuring the substrate on which the flame retardant insulation layer is formed;
    treating the substrate on which the flame retardant insulation layer is formed with 2-(2-butoxyethoxy)ethanol and ethane-1,2-diol;
    etching the result with 55 g/L NaMnO4, 18 g/L Na2MnO4, 45 g/L NaOH water solution;
    neutralizing with 60% $H_2SO_4$; and
    forming circuit patterns on the flame retardant insulation layer on which the roughness is formed.

2. The method of claim 1, wherein the amino triazine-containing curing agent is mixed in an equivalent ratio of 0.3 to 1.5 with respect to the total epoxy group equivalent of the complex epoxy resin.

3. The method of claim 1, wherein the curing accelerator is added by 0.1 to 1 parts by weight with respect to 100 parts by weight of the complex epoxy resin.

4. The method of claim 1, wherein the curing accelerator is added by 0.2 to 0.3 parts by weight with respect to 100 parts by weight of the complex epoxy resin.

5. The method of claim 1, wherein the inorganic filler is used by 20 to 50 parts by weight with respect to 100 parts by weight of the complex epoxy resin.

6. The method of claim 1, wherein the curing accelerator is an imidazole modified compound.

7. The method of claim 1, wherein the curing accelerator is at least one selected from the group consisting of 2-ethyl-4-methylimidazole, 1-(2-cyanoethyl)-2-alkylimidazole, 2-phenyl imidazole and a mixture thereof.

8. The method of claim 1, wherein the inorganic filler is at least one inorganic material selected from the group consisting of barium titanium oxide, barium strontium titanate, titanium oxide, lead zirconium titanate, lead lanthanum zirconate titanate, learn magnesium niobate-lead titanate, silver, nickel, nickel-coated polymer sphere, gold-coated polymer sphere, tin solder, graphite, tantalum nitride, metal silicon nitride, carbon black, silica, clay and aluminum borate.

9. The method of claim 1, wherein the inorganic filler is surface-treated with a silane coupling agent.

10. The method of claim 1, wherein the inorganic filler is in spherical shape having different sizes.

11. The method of claim 1, wherein the step of precuring is performed by maintaining at 140° C. to 160° C. for 20 to 40 minutes.

12. The method of claim 1, further comprising immersing in a 20-60% HF solution.

13. The method of claim 12, wherein when the step of immersing in a 20-60% HF solution is comprised, it further comprises precuring at 170° C. for 30 to 60 minutes.

* * * * *